(12) United States Patent
Chen et al.

(10) Patent No.: US 10,312,391 B2
(45) Date of Patent: Jun. 4, 2019

(54) APPARATUS AND METHOD FOR SINGLE-PHOTON AVALANCHE-PHOTODIODE DETECTORS WITH REDUCED DARK COUNT RATE

(71) Applicant: OmniVision Technologies, Inc., Santa Clara, CA (US)

(72) Inventors: Gang Chen, San Jose, CA (US); Duli Mao, Sunnyvale, CA (US); Vincent Venezia, Los Gatos, CA (US); Dyson H. Tai, San Jose, CA (US); Bowei Zhang, Fremont, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 347 days.

(21) Appl. No.: 15/285,201

(22) Filed: Oct. 4, 2016

(65) Prior Publication Data

US 2018/0097132 A1   Apr. 5, 2018

(51) Int. Cl.
*H01L 31/0352* (2006.01)
*H01L 31/02* (2006.01)
*H01L 31/107* (2006.01)
*H01L 31/0224* (2006.01)
*H01L 27/144* (2006.01)

(52) U.S. Cl.
CPC .. *H01L 31/035272* (2013.01); *H01L 27/1443* (2013.01); *H01L 31/02027* (2013.01); *H01L 31/022408* (2013.01); *H01L 31/107* (2013.01)

(58) Field of Classification Search
CPC ......... H01L 31/035272; H01L 27/1443; H01L 31/02027; H01L 31/022408; H01L 31/107
See application file for complete search history.

(56) References Cited

U.S. PATENT DOCUMENTS

| | | | |
|---|---|---|---|
| 3,792,197 A * | 2/1974 | Chai | H01J 29/455 257/431 |
| 2008/0277717 A1 | 11/2008 | Stein Von Kamienski | |
| 2013/0030763 A1 * | 1/2013 | Mazzillo | G01J 1/44 702/179 |
| 2015/0200222 A1 | 7/2015 | Webster | |

* cited by examiner

*Primary Examiner* — Georgia Y Epps
*Assistant Examiner* — Don J Williams
(74) *Attorney, Agent, or Firm* — Lathrop Gage LLP (57) ABSTRACT

An avalanche photodiode has a first diffused region of a first diffusion type overlying at least in part a second diffused region of a second diffusion type; and a first minority carrier sink region disposed within the first diffused region, the first minority carrier sink region of the second diffusion type and electrically connected to the first diffused region. In particular embodiments, the first diffusion type is N-type and the second diffusion type is P-type, and the device is biased so that a depletion zone having avalanche multiplication exists between the first and second diffused regions.

16 Claims, 5 Drawing Sheets

APPARATUS AND METHOD FOR SINGLE-PHOTON AVALANCHE-PHOTODIODE DETECTORS WITH REDUCED DARK COUNT RATE

FIELD

The present document relates to single-photon avalanche photodiodes (SPADs) and photodetector arrays that use SPADs to detect images in low light conditions.

BACKGROUND

Single-photon avalanche photodiodes 100 (SPADs) (FIG. 1) typically are P-I-N diodes that operate at high bias; such diodes have a P-doped (P) region 104 and an N-doped (N) region 106 formed adjacent to each other, or with a thin intrinsic (I) region lying between them, in a semiconductor material. The P region 104 and N region 106 are sufficiently close to each other that, with an applied reverse voltage bias, majority carriers are swept from a depletion zone 102 formed in a region between the N and P regions; with majority carriers swept from the depletion zone little or no current flows between the N and P regions.

Figure 1:
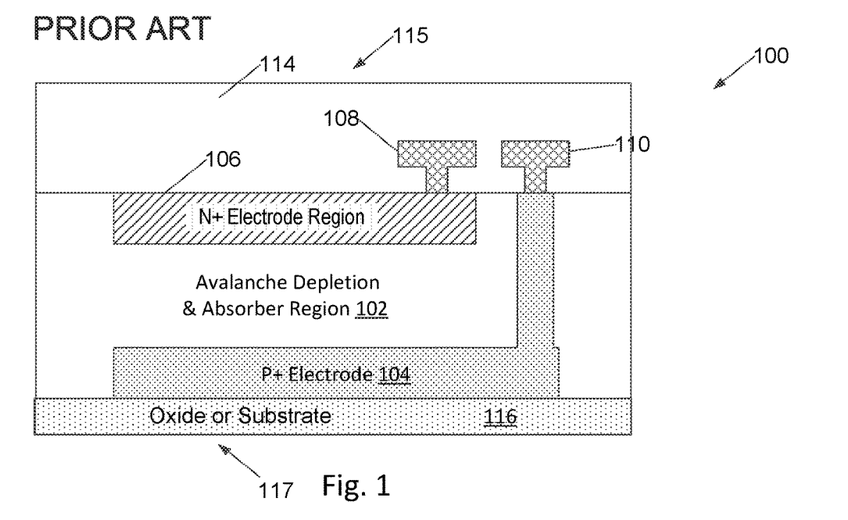
FIG. 1 is a prior-art schematic illustration of an avalanche photodiode of conventional design.

Photons are admitted into the photodiode through a front or back surface into the photodiode. Absorption of photons in the photodiode, whether in depletion zone 102 or in the N 206 or P 204 regions adjacent the depletion zone, causes, through the photoelectric effect, release of at least one electron-hole carrier pair that is attracted into the depletion zone 102 of the photodiode. The N or P regions may have subregions, not shown, of differing doping concentration to enhance photon absorption. Applied voltage bias is high enough that carriers such as a photoelectric electron-hole pair are amplified as the carriers trigger release of more electron-hole pairs in an avalanche breakdown, and gives a surge of current between the P 104 and N 106 regions. Interconnect 108 couples to the N region 106, and interconnect 110 to the P region 104 to connect the photodiode to other circuitry such as bias circuitry and sensing circuitry, not shown; one of N 104 and P 106 regions may be common to multiple photodiodes.

The avalanche photodiode is biased with circuitry configured so this surge of current typically drops bias voltage enough to "quench," or stop, current flow, or once current flow is detected the bias circuitry removes bias to quench current flow, after current flow is quenched bias is reset for further photon detection. Each surge of current triggered by each absorbed photon generates a signal that is amplified as an electronic indication of photon absorption.

SPADs may avalanche without photon absorption of desired light, giving extra, undesired, current surges, known as the dark count, that may be erroneously interpreted as indicating photon absorption. Since SPADs may respond to high-energy photons such as cosmic-ray, gamma and X-ray radiation, a portion of the dark count represents responses to undesired radiation. A portion of the dark count also results when minority carriers in the P 104 and N 106 regions are drawn into and amplified within the depletion zone 102.

It is known that some minority carriers are introduced at flaws in oxide-silicon interfaces. The interface between N region 106 and overlying dielectric oxide 114 is an example of such an interface.

The photodiode 100 typically has a frontside 115 into which diffusion and implant steps are performed during fabrication, and upon which interconnect metallization, such as metal 108, 110 are formed within dielectric oxide 114. The photodiode typically also has a backside 117 lacking metal interconnect lines 108, 110, although metal shield and mounting layers may be present. Backside 117 typically begins as a silicon or other semiconductor substrate upon which active layers of the photodiode are formed. In backside-illuminated devices, much of the semiconductor substrate is removed and typically a protective and stabilizing backside oxide or other transparent passivation coating is deposited after removal of the substrate. Both frontside and backside-illuminated photosensor arrays therefore overlay a layer 116 that includes an oxide, a substrate, or a non-oxide transparent passivation coating.

SUMMARY

In an embodiment, an avalanche photodiode has a first diffused region of a first diffusion type overlying at least in part a second diffused region of a second diffusion type; and a first minority carrier sink region disposed within the first diffused region, the first minority carrier sink region of the second diffusion type and electrically connected to the first diffused region. The first and second diffused regions are configured such that, when under bias, a depletion zone having avalanche multiplication characteristics forms between the first diffused region and the second diffused region. In particular embodiments, the first diffusion type is N-type and the second diffusion type is P-type, and the device is biased so that the depletion zone having avalanche multiplication exists between the first and second diffused regions.

A method of detecting photons includes providing a reverse bias to an avalanche photodiode having an N region and a P region, and thereby forming a depletion zone between the N region and P region. The method includes attracting minority carriers to minority carrier sinks from portions of the N region and the P region distant opposite from the depletion zone; and receiving photons to photoelectrically form carrier pairs, carriers are amplified in the depletion zone to produce a detectable current-flow. Current flow is then quenched and bias between the N and P regions is restored.

DETAILED DESCRIPTION OF THE EMBODIMENTS

Throughout this discussion, reference is made to intrinsic (I), N or N+, and P or P+, regions. A P, P+, or P-type region is a portion of a semiconductor material, typically but not necessarily a single crystal, "doped" (having a low level of impurities) with an excess of electron acceptor materials over electron donor materials as known in the art of semiconductor processing. P+ regions have concentrations of the electron acceptor materials at the high range of P regions on a particular circuit. Similarly, an N, N+, or N-type region is a portion of a semiconductor material, typically but not necessarily a single crystal, "doped" with impurities including an excess of electron donor materials over electron acceptor materials as known in the art of semiconductor processing. N+ regions have concentrations of the electron donor materials at the high range of N regions on a particular circuit. Intrinsic or I regions are regions of low or no net dopant. The semiconductor material may be silicon, germanium, gallium arsenide, or another semiconductor known in the art of photodiodes and chosen according to a wavelength of light for which detection is desired. Electron acceptor materials useful as dopants in silicon include boron, gallium, and indium. Electron donor materials useful as dopants in silicon include phosphorus, arsenic, antimony, and lithium. The majority carriers in N-type materials are electrons, with "holes"-positions in the crystal where an electron can fit, but is not present—as minority carriers; majority carriers are responsible for most electrical current flow in the semiconductor. The majority carriers in P-type materials are holes, while minority carriers are electrons.

N, N+, N-type P, P+, or P-type regions, which may be referred to as diffused regions regardless of how they are formed, may be formed in any of several ways; known ways to form N, N+, P, and P+ regions include ion implantation, exposure to gaseous dopant materials at high temperatures to permit dopant to diffuse into the semiconductor, coating with dopant materials and exposure to high temperatures to permit dopant to diffuse into the semiconductor, or by semiconductor crystal growth from a gas or liquid mixture contributing both semiconductor and dopant to growing crystal. Multiple ways of forming doped regions may be used to form the same circuit; for example, but not limitation, a substrate of a first doping type may have a first region of a second doping type diffused into it from a gaseous source, a layer including a second region grown epitaxially with dopant in the growth gas mixture, and a third region formed by ion implantation in the second region.

Applicant has found that some of the dark count in the conventional avalanche photodiode of FIG. 1 results when minority carriers in the P region 104 or N region 106 are drawn into and amplified within the highly-biased depletion zone 102. Applicant has found that some of these minority carriers originate from crystal defects at boundaries between diffused regions like N region 106 and oxide 114. In backside-illuminated photodiodes where oxide or substrate 116 is an oxide, applicant found some of these minority carriers originate between that oxide and P region 104; these minority carriers are then drawn by electric fields within P region 104 and N region 106 into depletion zone 102. Once in the depletion zone, these carriers are amplified to produce current indistinguishable from current flow stimulated by photon absorption.

Applicant has determined that minority carrier sinks located in the N and P regions of the photodiode near the oxide-silicon interfaces can trap non-photoelectric minority carriers originating at silicon-oxide interfaces. Such trapping of non-photoelectric minority carriers prevents them from entering highly-biased avalanche region 102 without significantly reducing sensitivity to photoelectric photons.

To reduce the minority carriers originating at boundaries between diffused regions and oxide, Applicant has used minority carrier sinks to redesign an avalanche photodiode as in the embodiments illustrated in FIGS. 2A-2E.

In the embodiments of an avalanche photodiode detector 200, 250, 260, 270, 280 having a reduced dark count rate, a depletion zone 202 is formed between a P region 204 and an N region 206. The depletion zone 202 may in some embodiments include a thin layer of intrinsic semiconductor. When under bias, depletion zone 202 has avalanche multiplication characteristics. A metal interconnect 208 couples to the N region 206, and a metal interconnect 210 to a P region 204 to connect the photodiode 200 to other circuitry such as bias circuitry and sensing circuitry, not shown.

In the embodiments of an avalanche photodiode detector 200, 280, 250 (FIGS. 2A, 2B, 2C), shallow P+ minority carrier sinks 212 are embedded in the oxide surface of N region 206, the P+ minority carrier sinks 212 lie beneath oxide 114 within which metal interconnect 208, 210 is embedded. P+ minority carrier sinks 212 may have a grid shape, as further illustrated in FIGS. 4 and 6. The grid shape has windows therein providing less attenuation to short-wavelength blue light than that offered by sheet shapes such as that offered by P+ minority carrier sink 262 illustrated in the embodiment 260 of FIG. 2D.

Figure 2A:
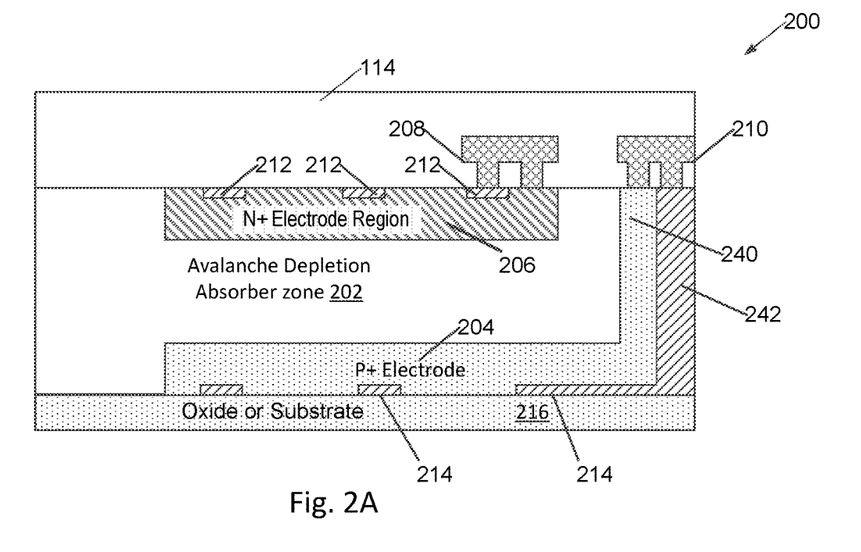
FIG. 2A is a schematic cross-sectional illustration of an avalanche photodiode having grid-shaped minority carrier sinks in both N and P regions, in an embodiment.
Figures 2B, 2C:
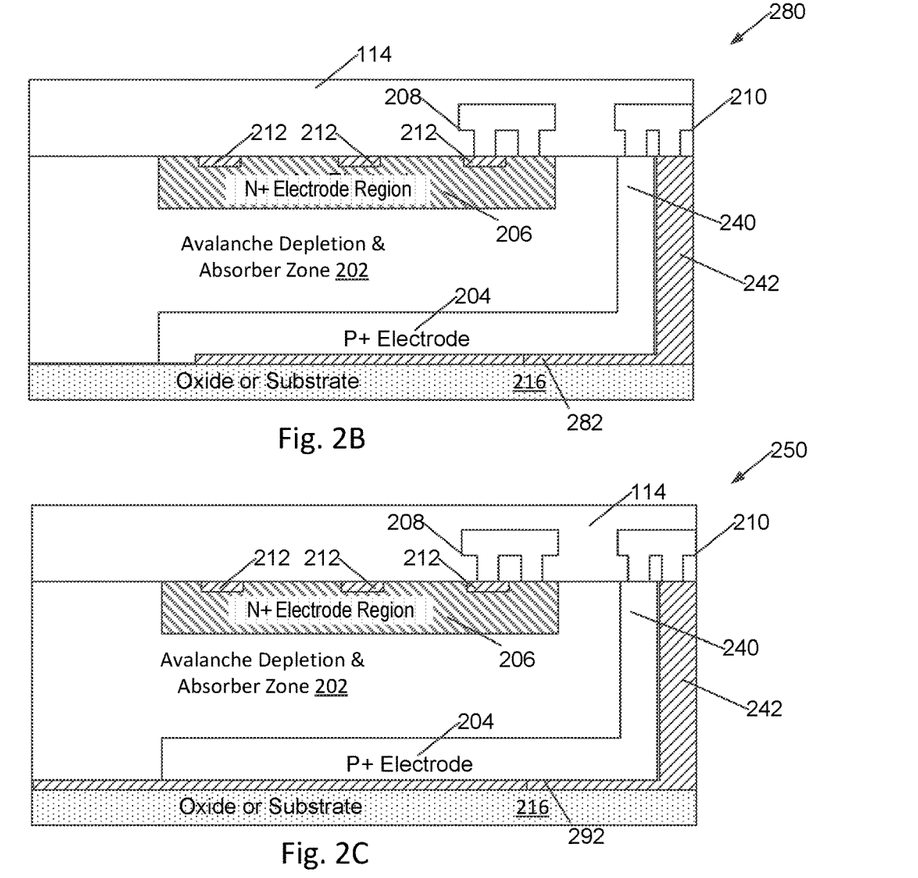
FIG. 2B is a schematic cross-sectional illustration of an avalanche photodiode having separate implanted rectangular minority carrier sinks in P regions and grid-shaped carrier sinks in N regions for frontside illumination, in an embodiment.
FIG. 2C is a schematic cross-sectional illustration of an avalanche photodiode having an implanted rectangular minority carrier sink across the photosensor array's entire backside with grid-shaped carrier sinks in N regions for frontside illumination, in an embodiment.
Figure 2D:
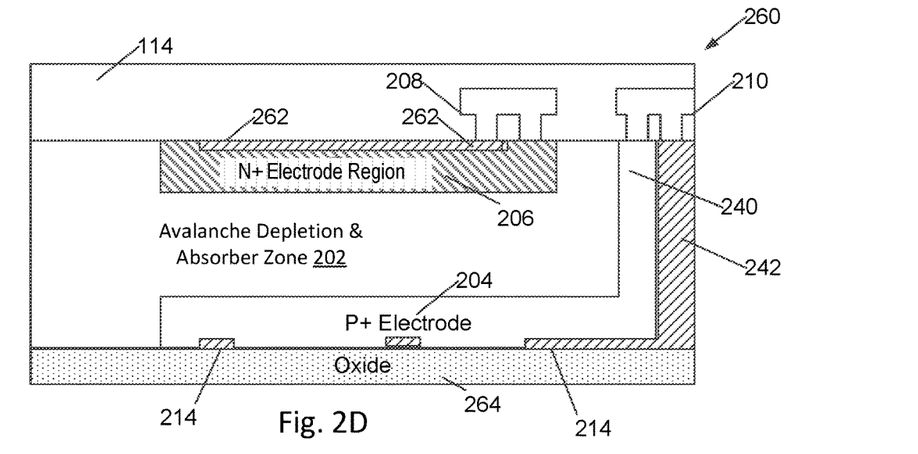
FIG. 2D is a schematic cross-sectional illustration of an avalanche photodiode having a backside minority carrier-sink grid, in an embodiment.
Figure 2E:
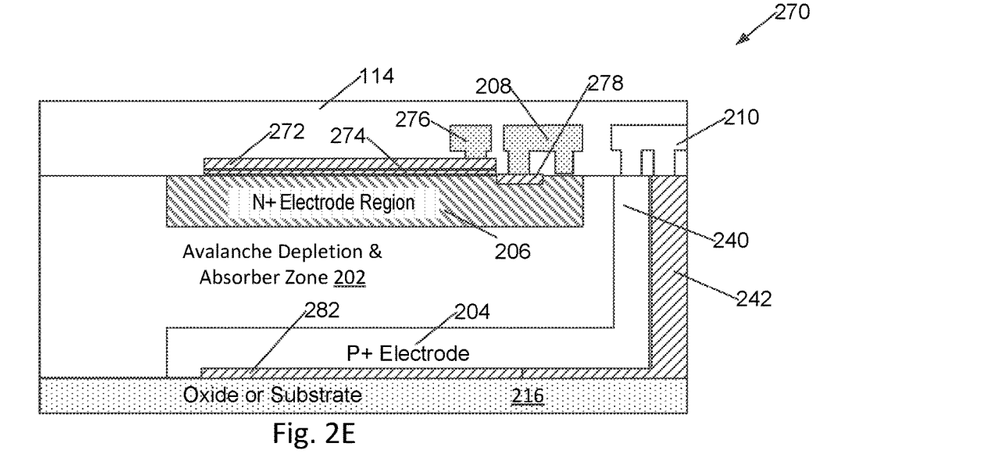
FIG. 2E is a schematic cross-sectional illustration of an avalanche photodiode having an inversion-layer minority carrier-sink promoted by a biased transparent electrode.

Similarly, N-type minority carrier sinks 214 are embedded in a surface of P region 204 distal to the N region 206. N-type minority carrier sinks 214 may have grid shape as illustrated in avalanche photodiode detectors 200, 260 (FIGS. 2A, 2D).

Both N and P minority carrier sinks 212, 214 are distributed such that they can absorb minority carriers from much of N 206 and P 204 regions. In some embodiments of avalanche photodiode detector 260, (FIG. 2D), where substrate has been thinned in making a backside-illuminated photosensor array, sinks are disposed in P region 204 adjacent to a transparent oxide 264 or other transparent passivation coating. In frontside illuminated photosensor arrays, P region 204 may lie over either oxide or a semiconductor, typically silicon, substrate 216.

In many embodiments, as illustrated in FIGS. 2A-2D, these minority carrier sinks are formed as shallow diffused regions within each of P region 204 and N region 206, of opposite polarity to those regions, located near the oxide-silicon or silicon-substrate interfaces of these regions.

In many embodiments, each minority carrier sink is electrically coupled to the P region 204 or N region 206 within which it lies; in alternative embodiments, minority carrier sinks are brought out through separate interconnect to permit reverse-biasing at other voltages than the zero volts implied by electrically coupling them to the region in which they lie.

In many embodiments, deep P-type diffusion 240 and N-type diffusion 242 (FIGS. 2A, 2B, 2C, 2D, 2E) are provided to allow for electrical contact from interconnect 210 to P electrode region 204 and to N minority carrier sink 214.

In an alternative embodiment 280 (FIG. 2B), N-type minority carrier sink 282 embedded in P region 204 is a sheetlike implanted rectangle confined within P region 204, to which it may be electrically connected as shown.

In another alternative embodiment 250 (FIG. 2C), N-type minority carrier sink 292 is a sheet implant across all P regions 204 of the array, this embodiment is of particular utility where all P regions 204 of an array are at a same reference potential near potential of sheet implant minority carrier sink 292.

In another alternative embodiment 270 (FIG. 2E), the P-type minority carrier sink is formed as an inversion layer generated by applying a nonzero voltage bias to an electrode 272, which may in some embodiments be formed in a same step as formation of gate electrodes of field-effect transistors located within the photosensor array integrated circuit. This inversion layer corresponds roughly to the channel of a MOS transistor. In these embodiments, electrode 272 is separated from N region 206 by a thin oxide 274 that may in some embodiments be formed in a same step as that used to form gate oxide of transistors on the same photosensor array integrated circuit. In embodiments, a connection region 278, corresponding to the source or drain region of a field-effect transistor, is provided to electrically couple the inversion layer formed under electrode 272 to a metal contact that in turn electrically couples this inversion layer to N region 206. In particular embodiments tailored to frontside illumination, electrode 272 is formed of a transparent electrical conductor such as indium tin oxide or electrode 272. In particular embodiments, electrode 272 and thin oxide 274 may have a grid shape for admitting photons past electrode 272 into the photosensors. Electrode 272 may couple to separate interconnect 276 to permit biasing electrode 272 with an appropriate voltage. In other particular embodiments tailored to backside illumination, frontside electrode 272 is formed of polysilicon, aluminum, or another metal. In frontside-illuminated embodiments, N minority carrier sink 282 in P electrode region 204 may have sheet or rectangle shape, in backside-illuminated embodiments N minority carrier sink 282 may have grid or other discontinuous shape. Use of a minority carrier sink induced by a voltage on a transparent conductor is not limited to frontside illumination, in an alternative embodiment (not shown) a transparent conductor is applied to the backside surface and forms minority carrier sinks within P diffused electrode regions 204 when an appropriate bias is applied between the transparent conductor and P regions 204.

Some embodiments may have minority carrier sinks having solid sheet or non-gridded rectangular shape in both N and P electrodes, including embodiments optimized for long-wavelength photon detection such as infrared imagers, and embodiments optimized for high-energy X-ray or gamma-ray detection such as X-ray imagers, CT-scanners, positron-emission tomography (PET) scanners, gamma-cameras, and solid-state Geiger-counters.

Figure 4:
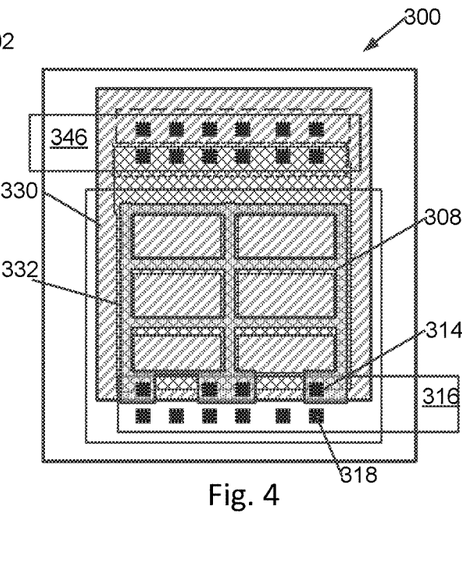
FIG. 4 is a layout diagram showing minority carrier sink distribution, in an embodiment.
Figure 5:
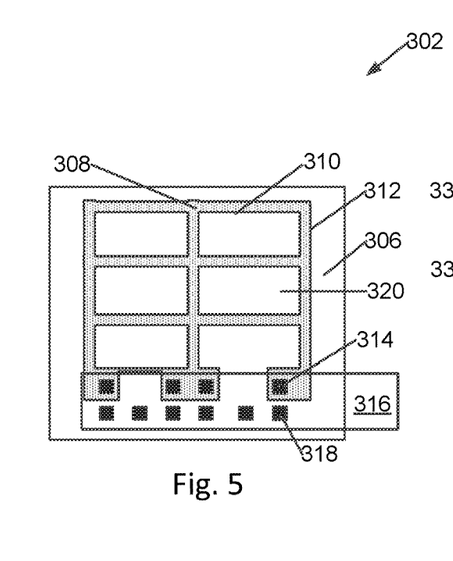
FIG. 5 is a layout diagram showing top layers of the embodiment of FIG. 4.
Figure 6:
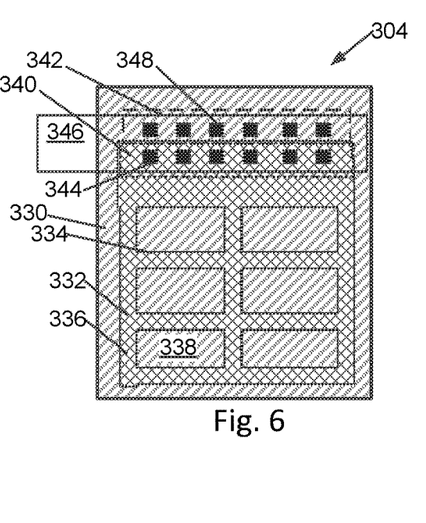
FIG. 6 is a layout diagram showing bottom layers of the embodiment of FIG. 4.

An exemplary layout 300 of an avalanche photodiode embodiment corresponding to FIG. 2A is shown in FIGS. 4, 5, and 6, with mask shapes for ancillary structures like guard rings omitted.

FIG. 4 shows mask shapes in a layout plan view associated with both the N and P electrodes of the photodiode 300. For sake of clarity, adjacent FIG. 5 illustrates only drawn shapes 302 associated with the N electrode of FIG. 4, and adjacent FIG. 6 illustrates only drawn shapes 304 associated with the P electrode of FIG. 4, these drawn shapes correspond approximately to a plan view of N and P regions produced on the device.

The N electrode 302 has an N-type diffused region 306, serving as N region 206 (FIG. 2). Within N-type diffused region 306 is a shallow P-type minority-carrier sink grid 308, which serves as P-type minority carrier sinks 212. P-type minority carrier sink grid 308 includes grid lines 310 and grid columns 312. Spacing between grid lines 310 and grid columns 312 may be such that, except as necessary for metal contacts, no portions of N-type diffused region 306 is further from a grid line 310 or column 312 than depth of N-type diffused region 306. In a particular embodiment, grid line 310 and column 312 width and spacing are determined by experiment, balancing dark count rate and optical performance. Metal contacts 314 are provided to couple grid 308 to an overlying N-electrode metal interconnect 316, and metal contacts 318 couple N-type diffused region 306 to N-electrode metal interconnect 316. Metal interconnect 316 is provided to couple the N-electrode of the avalanche photodiode 300 to other circuitry (not shown) of the integrated-circuit photosensor array such as bias circuits, decoders, and sense amplifiers.

In frontside-illuminated (FSI) embodiments, openings 320 between grid lines 310 and columns 312 boost blue-light sensitivity over alternative embodiments without openings. In backside-illuminated (BSI) embodiments, or embodiments for which sensitivity to red or infrared light is paramount, openings 320 may be omitted with the shallow grid becoming a shallow sheet of P-type minority carrier sink embedded within N-type region 306.

Similarly, P electrode 304 (FIG. 6) has a buried, P-type region 330 serving as P+ electrode region 204 (FIG. 2), much of which lies completely under N-type region 306. Within and lying beneath P-type region 330 is an N-type minority carrier sink grid 332, serving as N-type minority carrier sinks 214. In an embodiment, N-type minority carrier sink grid 332 has spacing between grid lines 334 and grid columns 336 such that, except as necessary for metal contacts, no portions of P-type region 330 underlying the depletion and avalanche zone and N electrode 302 is further from a grid line 334 or column 336 than a depth of P-type diffused region 304, in principle.

While openings in N-type minority carrier sink grid 332 and P-type minority carrier sink grid may, in some embodiments, roughly align as illustrated in FIGS. 4, 5, and 6, this alignment is coincidental and is not required for circuit operation.

In BSI embodiments, openings 338 between grid lines 334 and columns 336 boost blue-light sensitivity over an alternative embodiment without openings. In FSI embodiments, or embodiments for which sensitivity to red light or infrared light is paramount, openings 338 may be omitted with the thin N-type grid 332 becoming a shallow sheet of N-type minority carrier sink embedded within P-type region 330.

A deep P-type diffusion 340, 240, which may be shared among multiple photodiodes, provides a path to metal contacts 344 provided to couple P electrode 304 to P-electrode metal interconnect 346. A deep N-type diffusion 342, 242 provides a path to metal contacts 348 that couple N-type minority carrier sink grid 332 to P-electrode metal interconnect 346.

Figure 3:
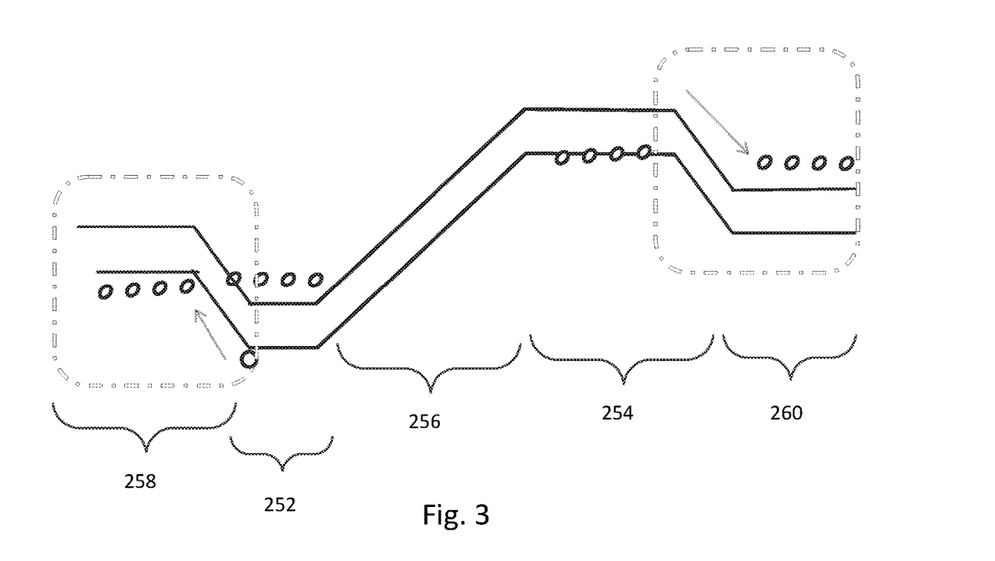
FIG. 3 is a bandgap diagram of an avalanche photodiode, in an embodiment.

The structure of FIGS. 2A-2E and 4-6, under moderate bias, provides an energy level corresponding to N 252 and P 254 electrode energy levels, illustrated in FIG. 3, with avalanche depletion region 256 between N 252 and P 254 electrode energy levels. The minority carrier sink regions 212, 214 provide sink energy levels 258, 260 surrounding the electrode and depletion region energy levels, providing field that attracts minority carriers from nearby portions of electrodes 204, 206 as represented by the N 252 and P 254 electrode energy levels illustrated.

In an alternative embodiment, instead of directly coupling the minority carrier sink regions to their associated electrodes with metal interconnect as shown, one or both of the minority carrier sinks 212, 214 (FIG. 2A) is electrically coupled to a metal interconnect separate from metal interconnects 208 and 210 that couple to the N 206 and P 204 electrode regions within which the minority carrier sink lies. In this embodiment, a reverse bias is applied between the minority carrier sink and its surrounding N or P electrode region. Operation of this embodiment is similar to that described above, although openings 320, 338, in grid-shaped minority carrier sinks may be larger than with the sink regions directly connected to the electrode regions.

An avalanche photodetector is constructed using the photodiode illustrated in FIGS. 2, 4, 5, and 6 by applying a voltage bias to the N region 206 relative to the P region 204 such that a depletion zone having avalanche multiplication characteristics forms between the N and P regions. With appropriate bias, the avalanche photodetector is operable in Geiger, or single-photon counting, mode.

Figure 7:
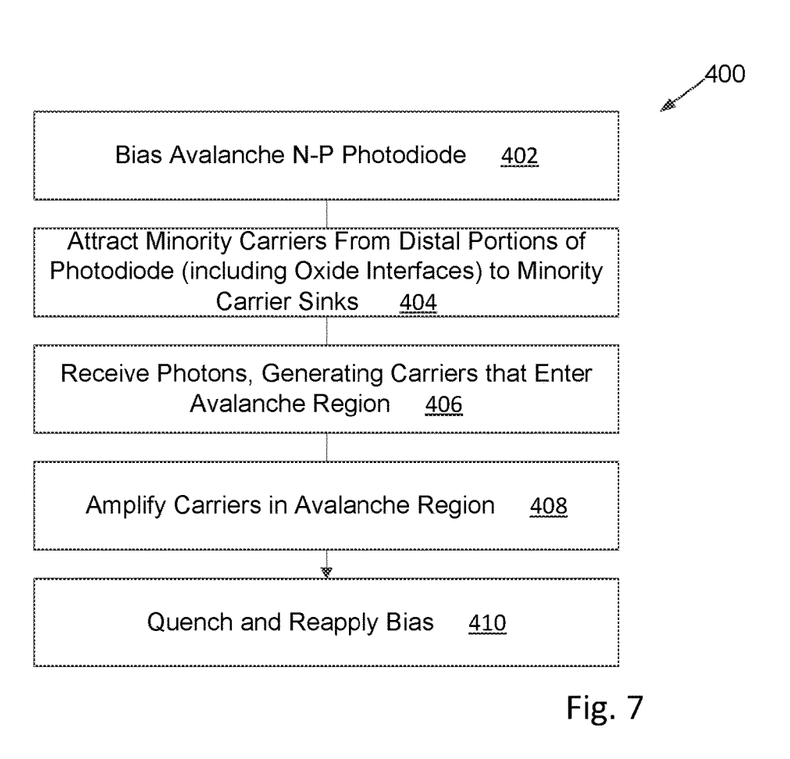
FIG. 7 is a flowchart of a method of detecting low levels of light, in an embodiment.

FIG. 7 is a flowchart illustrating an exemplary operation 400 of an avalanche photodetector having an avalanche photodiode. A high reverse bias is applied 402 to an avalanche photodiode, the avalanche photodiode including N region 206 (FIG. 2A) and P region 204; this reverse bias forms an avalanche depletion zone 202. Minority carriers originating in portions of N region 206 and P region 204 distant from, or on a side of N region 206 or P region 204 opposite avalanche depletion zone 202, are attracted 404 to the minority carrier sinks 212, 214; this includes at least some minority carriers originating at oxide-semiconductor interfaces. These minority carriers are not allowed, as in conventional avalanche photodiodes, to enter the avalanche depletion zone 202. Photons are then received 406 in the depletion zone 202, each photon exceeding a threshold energy triggers formation of a carrier pair; this carrier pair is amplified 408 in the depletion zone to produce a detectable current-flow signal. Current in the avalanche and absorber region is quenched 410 as voltage bias dips, and the high reverse bias is reapplied; thereby preparing the photodetector to receive additional photons. In embodiments, the detectable current-flow signals are counted to determine a flux of photons received by the photodiode.

Combinations

The features discussed herein may appear in various combinations in devices. In particular, the minority carrier sinks may have grid or waffle shape, sheet shape, disk shape, winged-disk shape, or such other shape as may be convenient when laying out the photodiode. The photodiode N and P regions associated with the avalanche region may have rectangular, discoidal, or such other shape as convenient during layout of the device. Some of these combinations include:

An avalanche photodiode designated A having a first diffused region of a first diffusion type; the first diffused region overlying at least in part a second diffused region of a second diffusion type; and a first minority carrier sink region disposed within the first diffused region, the first minority carrier sink region being of the second diffusion type. The first and second diffused regions are configured such that a depletion zone having avalanche multiplication characteristics forms between the first diffused region and the second diffused region when under bias.

An avalanche photodiode designated A1 including the avalanche photodiode designated A wherein the first minority carrier sink region is electrically connected to the first diffused region An avalanche photodiode designated AA including the avalanche photodiode designated A or A1, further including a second minority carrier sink region disposed within the second diffused region, the second minority carrier sink region being of the first diffusion type, and electrically connected to the second diffused region.

An avalanche photodiode designated AB including the avalanche photodiode designated A, AA or A1, the first diffusion type being N type and the second diffusion type being P type.

An avalanche photodiode designated AC including the avalanche photodiode designated A, AA, AB or A1 the shape of the first minority carrier sink region being a grid.

An avalanche photodiode designated AD including the avalanche photodiode designated AA, AB, or AC the shape of the second minority carrier sink region being a grid.

An avalanche photodetector designated B including the avalanche photodiode designated A, A1, AA, AB, AC, or AD, further comprising voltage bias circuitry adapted to apply a voltage bias to the first diffused region relative to the second diffused region sufficient that the depletion zone having avalanche multiplication characteristics forms between the first and second diffused regions.

An avalanche photodetector designated BA including the avalanche photodetector designated B, the voltage bias being configured to operate the avalanche photodetector in a single-photon counting mode.

A method of detecting photons designated C including providing a reverse bias to an avalanche photodiode having an N region and a P region, and thereby forming a depletion zone between the N region and P region; attracting minority carriers to minority carrier sinks from portions of the N region and the P region opposite the depletion zone; receiving photons and forming carrier pairs; amplifying the carrier pairs in the depletion zone to produce a detectable current-flow; quenching current flow; and re-biasing the N and P regions.

A method designated CA including the method designated C, wherein at a first minority carrier sink is a shallow P type region embedded in the N region of the photodiode.

A method designated CB including the method designated C or CA wherein the first minority carrier sink is electrically connected to the N region of the photodiode.

A method designated CC including the method designated C, CA, or CB wherein the first minority carrier sink is embedded in a portion of the N region of the photodiode opposite from the depletion zone.

A method designated CD including the method designated C, CA, CB, or CC wherein a second minority carrier sink is an N-type region embedded in the P region of the photodiode.

A method designated CE including the method designated CD, wherein the second minority carrier sink is electrically connected to the P region of the photodiode.

A method designated CF including the method designated CD or CE wherein the first minority carrier sink is embedded in a portion of the P region of the photodiode opposite from the depletion zone.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. An avalanche photodiode comprising:
   a first diffused region of a first diffusion type;
   the first diffused region overlying at least in part a second diffused region of a second diffusion type;
   a first minority carrier sink region disposed within the first diffused region, the first minority carrier sink region being of the second diffusion type; and
   a second minority carrier sink region, disposed within the second diffused region, the second minority carrier sink region being of the first diffusion type;
   wherein the first and second diffused regions are configured such that a depletion zone having avalanche multiplication characteristics forms between the first diffused region and the second diffused region when under bias.

2. The avalanche photodiode of claim 1 wherein the first minority carrier sink region is electrically connected to the first diffused region.

3. The avalanche photodiode of claim 1 wherein the first minority carrier sink region is formed as an inversion region by applying a bias to an electrode overlying the first diffused region.

4. An avalanche photodiode comprising:
   a first diffused region of a first diffusion type;
   the first diffused region overlying at least in part a second diffused region of a second diffusion type; and
   a first minority carrier sink region disposed within the first diffused region, the first minority carrier sink region being of the second diffusion type;
   further comprising a second minority carrier sink region, disposed within the second diffused region, the second minority carrier sink region being of the first diffusion type, and electrically connected to the second diffused region;
   wherein the first and second diffused regions are configured such that a depletion zone having avalanche multiplication characteristics forms between the first diffused region and the second diffused region when under bias;
   wherein the first minority carrier sink region is electrically connected to the first diffused region.

5. The avalanche photodiode of claim 4, the first diffusion type being N type and the second diffusion type being P type.

6. The avalanche photodiode of claim 5, a shape of the first minority carrier sink region being a grid.

7. The avalanche photodiode of claim 6, a shape of the second minority carrier sink region being a grid.

8. An avalanche photodetector comprising the avalanche photodiode claim 5, further comprising voltage bias circuitry adapted to apply a voltage bias to the first diffused region relative to the second diffused region sufficient that the depletion zone having avalanche multiplication characteristics forms between the first and second diffused regions.

9. The avalanche photodetector of claim 8, the voltage bias being configured to operate the avalanche photodetector in a single-photon counting mode.

10. A method of detecting photons comprising:
    providing a reverse bias to an avalanche photodiode having an N region and a P region, and thereby forming a depletion zone between the N region and P region;
    attracting minority carriers to a P-type first minority carrier sink from portions of the N region opposite the depletion zone and attracting minority carriers to an N-type second minority carrier sink from the P region opposite the depletion zone;
    receiving photons and forming carrier pairs;
    amplifying the carrier pairs in the depletion zone to produce a detectable current-flow;
    quenching current flow; and
    re-biasing the N and P regions.

11. The method of claim 10, wherein the first minority carrier sink is a shallow P type region embedded in the N region of the photodiode.

12. The method of claim 11, wherein the first minority carrier sink is electrically connected to the N region of the photodiode.

13. The method of claim 12, wherein the first minority carrier sink is embedded in a portion of the N region of the photodiode opposite from the depletion zone.

14. A method of detecting photons comprising:
    providing a reverse bias to an avalanche photodiode having an N region and a P region, and thereby forming a depletion zone between the N region and P region;
    attracting minority carriers to minority carrier sinks from portions of the N region and the P region opposite the depletion zone;
    receiving photons and forming carrier pairs;
    amplifying the carrier pairs in the depletion zone to produce a detectable current-flow;
    quenching current flow; and
    re-biasing the N and P regions;
    wherein a first minority carrier sink is a shallow P type region embedded in the N region of the photodiode, the first minority carrier sink is electrically connected to the N region of the photodiode and embedded in a portion of the N region of the photodiode opposite from the depletion zone; and
    wherein a second minority carrier sink is an N-type region embedded in the P region of the photodiode.

15. The method of claim 14, wherein the second minority carrier sink is electrically connected to the P region of the photodiode.

16. The method of claim 15, wherein the first minority carrier sink is embedded in a portion of the P region of the photodiode opposite from the depletion zone.

* * * * *

UNITED STATES PATENT AND TRADEMARK OFFICE
CERTIFICATE OF CORRECTION

PATENT NO. : 10,312,391 B2
APPLICATION NO. : 15/285201
DATED : June 4, 2019
INVENTOR(S) : Gang Chen Page 1 of 1

It is certified that error appears in the above-identified patent and that said Letters Patent is hereby corrected as shown below:

In the Claims

Column 10, Line 54, Claim 16 "first minority" should read --second minority--.

Signed and Sealed this
Ninth Day of June, 2020

Andrei Iancu
*Director of the United States Patent and Trademark Office*